(12) United States Patent
Huang et al.

(10) Patent No.: US 9,930,785 B2
(45) Date of Patent: Mar. 27, 2018

(54) CONFIGURABLE HEAT CONDUCTING PATH FOR PORTABLE ELECTRONIC DEVICE

(71) Applicant: AZTRONG INC., Rockville, MD (US)

(72) Inventors: Kung-Shiuh Huang, Orange, CA (US); Kuan-Tsae Huang, Rockville, MD (US); June Wu, North Potomac, MD (US)

(73) Assignee: AZTRONG INC., Rockville, MD (US)

( * ) Notice: Subject to any disclaimer, the term of this patent is extended or adjusted under 35 U.S.C. 154(b) by 46 days.

(21) Appl. No.: 14/514,721

(22) Filed: Oct. 15, 2014

(65) Prior Publication Data

US 2015/0029660 A1     Jan. 29, 2015

(51) Int. Cl.
| | |
|---|---|
| *H05K 1/18* | (2006.01) |
| *G06F 1/16* | (2006.01) |
| *G06F 1/20* | (2006.01) |
| *H04M 1/02* | (2006.01) |
| *H05K 1/02* | (2006.01) |

(52) U.S. Cl.
CPC .......... *H05K 1/189* (2013.01); *G06F 1/1626* (2013.01); *G06F 1/203* (2013.01); *H04M 1/0235* (2013.01); *H04M 1/0256* (2013.01); *H05K 1/0209* (2013.01); *H05K 2201/0323* (2013.01); *H05K 2201/10128* (2013.01)

(58) Field of Classification Search
CPC ... H01L 23/3677; H01L 23/5389; G06F 1/20; G06F 1/206; H04M 1/0262; H04M 1/0214; H04M 1/0216; H04M 1/026; H04M 1/02; H04M 1/0256; H04M 1/021; H04M 1/0212; H04M 1/0235; H04M 1/0237; H04M 1/0239; H04M 1/0249; H04M 1/0252; H04M 1/0254; H04M 1/0258; H05K 2201/0323
See application file for complete search history.

(56) References Cited

U.S. PATENT DOCUMENTS

| | | | | |
|---|---|---|---|---|
| 4,471,837 | A  * | 9/1984 | Larson | F28F 21/02 165/185 |
| 5,991,155 | A  * | 11/1999 | Kobayashi | H01L 23/3672 165/80.2 |
| 6,324,055 | B1 * | 11/2001 | Kawabe | G06F 1/1616 361/679.54 |
| 6,487,073 | B2 * | 11/2002 | McCullough | G06F 1/203 257/E23.107 |
| 6,982,874 | B2 * | 1/2006 | Smalc | G06F 1/182 165/185 |
| 7,286,360 | B2 * | 10/2007 | Sohn | H01L 23/3672 257/E23.103 |
| 7,292,441 | B2 * | 11/2007 | Smalc | G06F 1/203 165/185 |
| 7,330,354 | B2 * | 2/2008 | Watanabe | G06F 1/203 174/252 |

(Continued)

*Primary Examiner* — Adam B Dravininkas
(74) *Attorney, Agent, or Firm* — Ditthavong & Steiner, P.C.

(57) ABSTRACT

A portable electronic device includes at least one energy module which further included thermoelectric materials which may convert heat to electric power. A plurality of heat removers selectively thermal contact to at least one wall of an enclosure of the portable electronic device depended on the configuration of the portable electronic device.

19 Claims, 9 Drawing Sheets

(56) References Cited

U.S. PATENT DOCUMENTS

| | | | | |
|---|---|---|---|---|
| 7,417,863 | B2* | 8/2008 | Park | H05K 7/20445 165/80.2 |
| 7,522,419 | B2* | 4/2009 | Huang | H04B 1/036 219/209 |
| 7,965,514 | B2* | 6/2011 | Hill | H04M 1/0277 361/679.54 |
| 7,969,739 | B2* | 6/2011 | Tsunoda | G06F 1/203 165/185 |
| 7,978,467 | B2* | 7/2011 | Ichikawa | H01H 9/52 200/314 |
| 2003/0103324 | A1* | 6/2003 | Gallivan | G06F 1/1616 361/679.27 |
| 2005/0079898 | A1* | 4/2005 | Park | H04M 1/0245 455/575.1 |
| 2006/0073859 | A1* | 4/2006 | Chou | H04M 1/0235 455/575.4 |
| 2006/0198101 | A1* | 9/2006 | Cho | G06F 1/1616 361/679.46 |
| 2006/0215362 | A1* | 9/2006 | Cho | G06F 1/20 361/679.46 |
| 2006/0274506 | A1* | 12/2006 | Huang | H04B 1/036 361/704 |
| 2007/0275774 | A1* | 11/2007 | Fagrenius | H04M 1/0235 455/575.4 |
| 2010/0005390 | A1* | 1/2010 | Bong | G06F 3/0414 715/702 |
| 2011/0096303 | A1* | 4/2011 | Horii | G03B 21/16 353/119 |
| 2012/0063072 | A1* | 3/2012 | Murakoso | E05D 11/084 361/679.01 |
| 2014/0022733 | A1* | 1/2014 | Lim | H05K 7/2039 361/718 |

* cited by examiner

CONFIGURABLE HEAT CONDUCTING PATH FOR PORTABLE ELECTRONIC DEVICE

BACKGROUND

Technical Field

The present disclosure relates to heat dissipation in electronic devices. More specifically, the present embodiments related to an electronic device having a configurable, flexible and ultra-thin heat remover for portable electronic devices with configurable heat conducting path depended the positions of the devices.

Related Art

In recent years, according to the development of electronic devices to meet the high performance and multi tasks, the generation of heat in the circuit or circuit elements such as computer CPU, powered transistor, semiconductor, and other heat generator etc. are increasing drastically. Electronic devices may include housing, and a set of packed components which are packed within a limited size of housing. Powerful computer components allow the design and construction of higher performance portable computing devices. However, the use of such powerful computer components often results in increased heat generation by these computing devices. Therefore, improved heat dissipation technology or structure is often needed to maintain operating temperatures of the electronic devices within proper range.

The cooling of heat generating components of an electronic device is performed, in general, by attaching a heat sink to the heat generating component(s) and the heat sink is radiated or transferred heat by the airflow of an airflow generator.

The heat-dissipation mechanisms for electronic devices generally involve the use of extra materials and/or parts. For instance, heat spreader, cooling fans, vents, heat pipes may be employed to remove heat from components in an electronic device.

Hence, compact designs for portable electronic devices may be designed by components and/or materials to avoid hot spots near certain components such as a processor, display, and/or storage.

SUMMARY OF THE INVENTION

Many aspects of the embodiments related to techniques for spreading of heat throughout a computer system or efficiently expelling heat, depended on the configuration or position of the device, to avoid overheat near certain components such as display, CPU, GPU, and other temperature sensitive components inside a compact electronic device. The portable electronic device comprises an energy module, at least one of a processor, power manage unit (PMU), at least one display module, at least one printed circuit board (PCB), at least one flexible printed circuit board (FPCB), at least one solid state disk (SSD), optional hard disk drive (HDD), at least one radio transceiver, and other components to work with the above components.

BRIEF DESCRIPTION OF THE FIGURES

The present invention is illustrated by way of example and not limitation in the figures of the accompanying drawing. The components in the drawings are not necessarily drawn to scale.

DETAILED DESCRIPTION

The disclosure is illustrated by way of example and not by way of limitation in figures of the drawings. It should be noted that references to "an" or "one" embodiment in this disclosure are not necessarily to the same embodiment, and such references mean at least one.

Graphene is pure carbon in the form of a very thin, nearly transparent sheet, one atom thick. It is remarkably strong for its very low weight (100 times stronger than steel) and it conducts heat and electricity with great efficiency.

Graphite is composed of layers of carbon atoms that are arranged in 6-membered, hexagonal rings. These rings are attached to one another on their edges. Layers of fused rings can be modeled as an infinite series of fused benzene rings (without the hydrogen atoms). The following table shows the comparison of thickness for different materials.

|  | Graphene | Grapheme thermal film | Graphite |
|---|---|---|---|
| Thickness (um) | 1-100 nm | >10 | 25-200 |

A graphene layer disclosed in the embodiments is ranged in 1-5 nm, 1-20 nm, 20-30 nm, 5-100 nm, and/or less than 1 mm.

Figure 1:
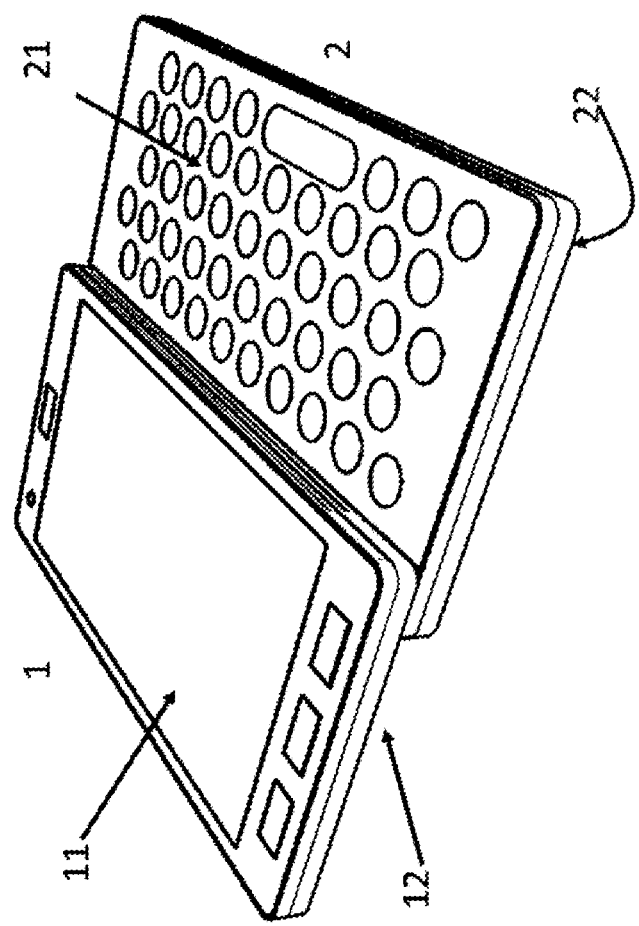
FIG. 1 shows a partial perspective view of an electronic device.

FIG. 1 shows the overview of the arrangement of a portable electronic device. The portable electronic device may correspond to a wrist-worn device, tablet, laptop, personal digital assistant (PDA), medial player, mobile phone, digital camera/camcorder, and/or any battery-powered electronic device. Referring to FIG. 1, the portable electronic device may comprise a first housing 1, a second housing 2, an optional connecting portion connected the first housing 1 and the second housing 2. The connecting portion further allows the first housing 1 and the second housing 2 to slide, rotate and/or pivot to each other. Therefore, both housings can be exposed.

Referring to FIG. 1, the first housing 1 of the portable electronic device comprises a first front wall 11, a first rear wall 12 and at least one display module on the first front wall 11, showing image, assembled with the front wall. There is an optional second display module (not shown) assembled with the rear wall to display image while the second display module of the first housing 1 is configured to not overlap with the second housing 2.

Referring to FIG. 1, the second housing 2 of the portable electronic device comprises a second front wall 21, a second rear wall 22 and at least one display module on the second front wall 21, showing image, assembled with the second front wall 21. There is an optional second display module (not shown) assembled with the rear wall to display image while the second display module of the second housing 2 is configured to not overlap with the first housing 1.

All the display modules, as disclosed in this invention, may be a touch screen with user input function, such as touch screen keyboard. Therefore, allows for typing the data through the display module. Furthermore, the display on the second front wall 21 and the display on the first rear wall 12 may be replaced as mechanical input interface (not shown) as another option.

Figure 2:
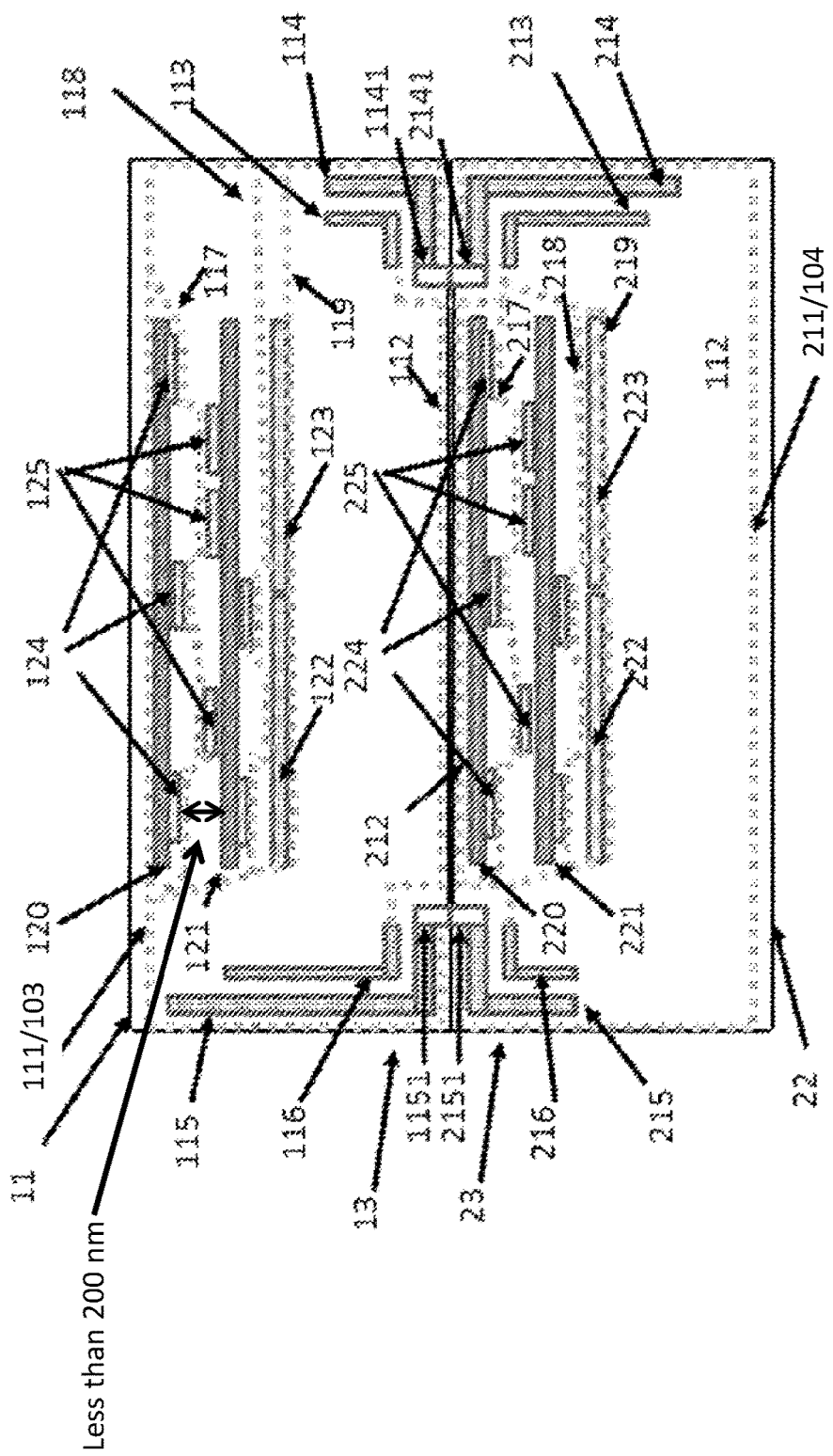
FIG. 2 shows a cross-section view of the electronic device of FIG. 1 with internal components and heat conduction structure.

FIG. 2 shows a cross-section view the portable electronic device. The first housing 1 comprising a first heat conduction path 111 which comprises a first housing heat remover 103, a second heat conduction path 112, a first reinforce end 113, a first engagement end 114, a first isolation 1141, a second isolation 1151, a second reinforce end 115, a second engagement end 116, a third heat conduction path 117, a fourth heat conduction path 118, a fifth heat conduction path 119, a first display module 120 comprising at least one first heat generator 124, at least one circuit board 121, may be printed circuit board (PCB) or flexible circuit board (FPCB), which comprising at least one second heat generator 125, a first energy module 122/123 and a second energy module 122/123.

The first and second heat conduction paths, the first and second reinforcing ends, and the first and second engagement ends, comprise heat conduct materials included metal, graphene/graphite, plastic, and/or combination of some of these materials. Therefore, these materials can maintain their rigid shapes and provide heat conducting function by using materials included highly heat conduct metals such as metal, graphene, and/or graphite. For another example embodiment, the above materials which can maintain rigid shapes may be implemented by metal or plastic, which mainly provides the rigid shapes, and attached with graphene layer (s).

However, third heat conduction path 117, the fourth heat conduction path 118, and the fifth heat conduction path 119 mainly comprise flexible heat conduct materials which mainly included at least one graphene layer and thermally contact the heat generators, energy modules, and merge with the first heat conduction path 111. In addition, at least one energy module 122/123 may supply power to circuit board, display module, and/or other components of portable electronic device. On the other hand, the second (or first) energy module 122/123 may comprise thermoelectric materials as a submodule, which converts heat to electrical energy (and the reverse) with no moving parts. The at least one energy modules 122/123 can provide electronic energy transfer from/to each other depends on the location of the thermoelectric submodule.

The first and second reinforcing ends 115 further comprise magnetic materials with different polarities (for example S vs. N, or N vs. S respectively). On the other hand, the first and second engagement ends further comprise material(s) which can be attracted by the magnetic materials, such as iron. However, the first reinforcing ends 113 on both first housing 1 and the second housing 2 comprise magnetic materials with same polarities; and the second reinforcing ends 115 on both first housing 1 and the second housing 2 comprise magnetic materials with same polarities, which is different from the polarities on the first reinforcing ends 113 on both the first housing 1 and the second housing 2.

FIG. 2 further shows a cross-section view the portable electronic device with the second housing 2 comprising a first heat conduction path 211 which comprises a second housing heat remover 104, a second heat conduction path 212, a first reinforce end 213, a first engagement end 214, a first isolation 2141, a second isolation 2151, a second reinforce end 215, a second engagement end 216, a third heat conduction path 217, a fourth heat conduction path 218, a fifth heat conduction path 219, a first display module 220 comprising at least one first heat generator 224, at least one circuit board 221, may be printed circuit board (PCB) or flexible circuit board (FPCB), which comprising at least one second heat generator 225, a first energy module 222/223 and a second energy module 222/223.

The first and second heat conduction paths, the first and second reinforcing ends, and the first and second engagement ends, comprise heat conduct materials included metal, graphene/graphite, plastic, and/or combination of some of these materials. Therefore, these materials can maintain their rigid shapes and provide heat conducting function by using materials included highly heat conduct metals such as metal, graphene, and/or graphite. For another example embodiment, the above materials which can maintain rigid shapes may be implemented by metal or plastic, which mainly provides the rigid shapes, and attached with graphene layer (s).

However, third heat conduction path 217, the fourth heat conduction path 218, and the fifth heat conduction path 219 mainly comprise flexible heat conduct materials which mainly included at least one graphene layer and thermally contact the heat generators, energy modules, and merge with the first heat conduction path 211. In addition, at least one energy module 222/223 may supply power to circuit board, display module, and/or other components of portable electronic device. On the other hand, the second (or first) energy modules may comprise thermoelectric materials as a submodule, which converts heat to electrical energy (and the reverse) with no moving parts. The at least one energy modules can provide electronic energy transfer from/to each other depends on the location of the thermoelectric submodule.

The first and second reinforcing ends, in the second housing 2, further comprise magnetic materials with different polarities (for example S vs. N, or N vs. S respectively). On the other hand, the first and second engagement ends further comprise material(s), such as iron, which can be attracted by the magnetic materials.

FIG. 2 illustrates the portable electronic device with close configuration. In this configuration, the first housing 1 and the second housing 2 are configured with the first rear wall 12 of the first housing 1 covering a surface of the display module of the first front wall 11 of the second housing 2.

Wherein, the first housing 1 is on top of the second housing 2 and a portion of the first rear wall 12 of the first housing 1 with the first engagement end 114 and a portion of the second front wall 21 of the second housing 2 with the first engagement end 214 are overlap. And, a portion of the first rear wall 12 of the first housing 1 with the second engagement end 116 and a portion of the second front wall 21 of the second housing 2 with the second engagement end 216 are overlap.

Therefore the first and second reinforcing ends of the first housing 1 and the first and second reinforcing ends of the second housing 2 are pushed away from each other due to the magnetic field and the flexibility of the heat conduction path as discussed above. Therefore, the second heat conduction path is no longer thermal connected to the first heat conduction path in both the first housing 1 and the second housing 2.

Figure 3:
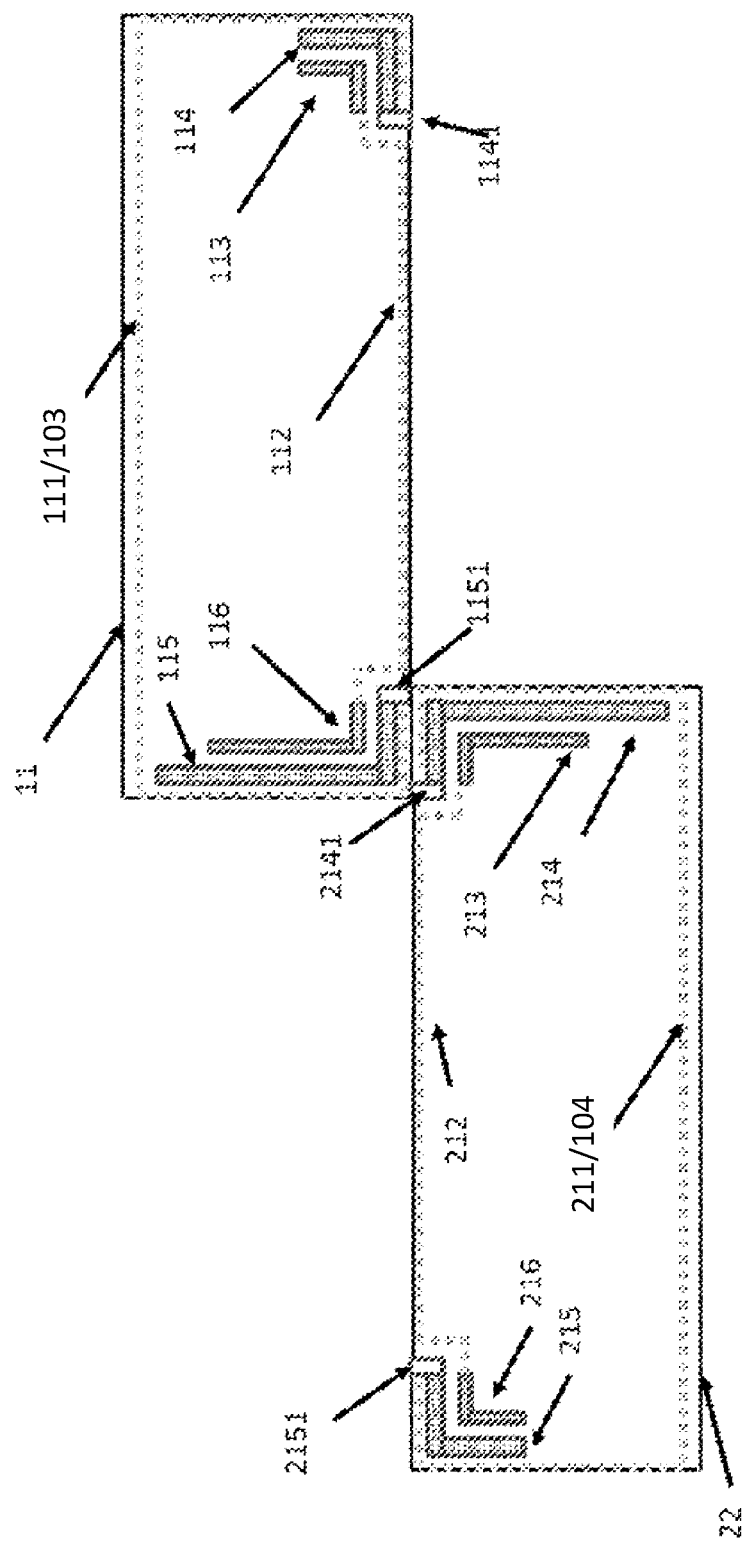
FIG. 3 shows another cross-section view of the electronic device of FIG. 1 with different configuration. In order to illustrate this configuration clearly, the internal components are not shown.
Figure 4:
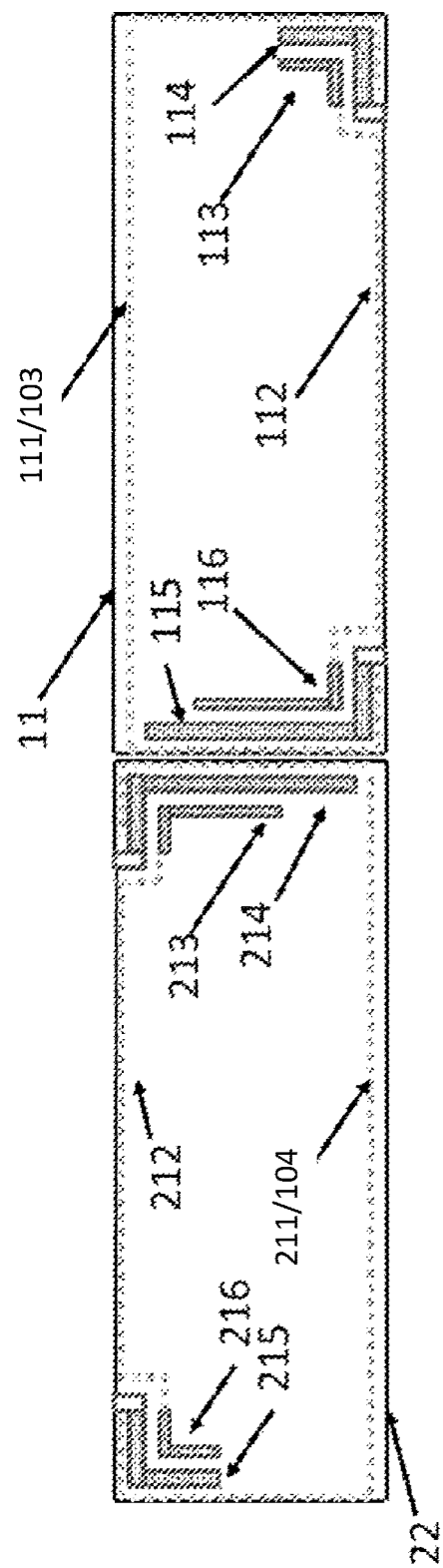
FIG. 4 shows another cross-section view of the electronic device of FIG. 1 with different configuration. In order to illustrate this configuration clearly, the internal components are not shown.

FIG. 3 and FIG. 4 illustrate the portable electronic device with different open configurations. Referring to FIG. 3, the first housing 1 and the second housing 2 are configured with both a surface of the display module of the first front wall 11 of the first housing 1 and a surface of the display module of the first front wall 11 of the second housing 2 are exposed. Wherein, the first housing 1 is on top of the second housing 2 and a portion of the first rear wall 12 of the first housing 1 with the second engagement end 116 and a portion of the second front wall 21 of the second housing 2 with the first engagement end 214 are overlap. Therefore the second reinforcing end of the first housing 1 and the first reinforcing end 213 of the second housing 2 are attracted to each other due to the magnetic force. These magnetic forces (from top and bottom) will cause the second reinforcing end 115 of the first housing 1 contact to the second engagement end 216 and the first reinforcing end 213 of the second housing 2 contact to the first engagement end 214 of the second housing 2.

Therefore, the second heat conduction path is thermal connected to the first heat conduction path in both the first housing 1 and the second housing 2 through the contact of the first reinforcing end, engagement end and the first heat conduction path.

Referring again to FIG. 3, the first reinforcing end 113 of the first housing 1 contact with the first engagement end 114 of the first housing 1, and the second reinforcing end 215 of the second housing 2 contact with the second engagement end 216 of the second housing 2 due to the magnetic file of the first and second reinforcing ends attract the first and second engagement ends. Therefore, the second heat conduction path 112 is thermal connected to the first heat conduction path 111 in both the first housing 1 and the second housing 2 through the contact of the first reinforcing end 113, engagement end and the first heat conduction path 111 through the other end of the housings. In order to clearly show the reinforcing ends and the engagement ends, the drawings still shows a gap between the reinforcing ends and the engagement ends. These reinforcing ends and the engagement ends are actually thermally contact to each other, as discussed.

Referring to FIG. 4, the first housing 1 and the second housing 2 are configured with both a surface of the display module of the first front wall 11 of the first housing 1 and a surface of the display module of the first front wall 11 of the second housing 2 are exposed. Wherein, the first housing 1 is arranged next to the second housing 2 and a portion of a side wall of the first housing 1 with the second engagement end 116 and a portion of a side wall of the second housing 2 with the first engagement end 114 are placed next to each other. Therefore the second reinforcing end 115 of the first housing 1 and the first reinforcing end 213 of the second housing 2 are attracted to each other due to the magnetic forces. These magnetic forces (from left and right of the FIG. 4) will cause the second reinforcing end 115 of the first housing 1 contact to the second engagement end and the first reinforcing end 213 of the second housing 2 contact to the first engagement end 214 of the second housing 2.

Therefore, the second heat conduction path 112 is thermal connected to the first heat conduction path 111 in both the first housing 1 and the second housing 2 through the contact of the first reinforcing end 113, engagement end and the first heat conduction path 111.

Referring again to FIG. 4, the first reinforcing end 113 of the first housing 1 contact with the first engagement end 114 of the first housing 1, and the second reinforcing end of the second housing 2 contact with the second engagement end 216 of the second housing 2 due to the magnetic file of the first and second reinforcing ends attract the first and second engagement ends. Therefore, the second heat conduction path 112 is thermal connected to the first heat conduction path 111 in both the first housing 1 and the second housing 2 through the contact of the first reinforcing end 113, engagement end and the first heat conduction path 111 through the other end of the housings.

Figure 5:
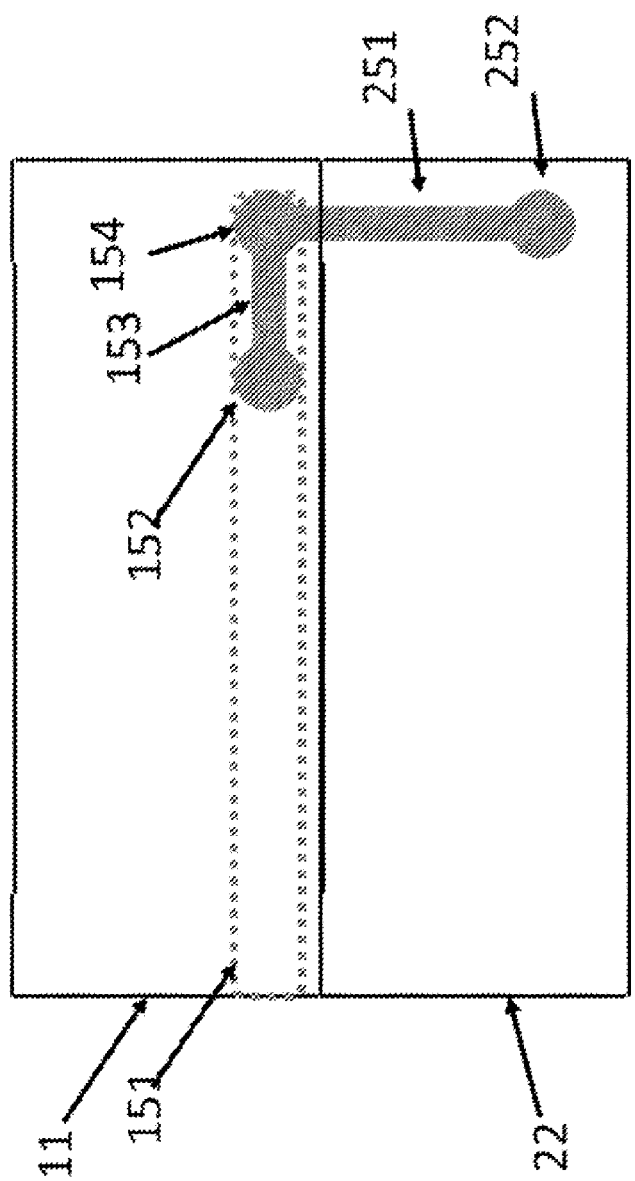
FIG. 5 shows another cross-section view of the electronic device of FIG. 1 with the linking structure. In order to illustrate this configuration clearly, only the linking structure is shown.
Figure 6:
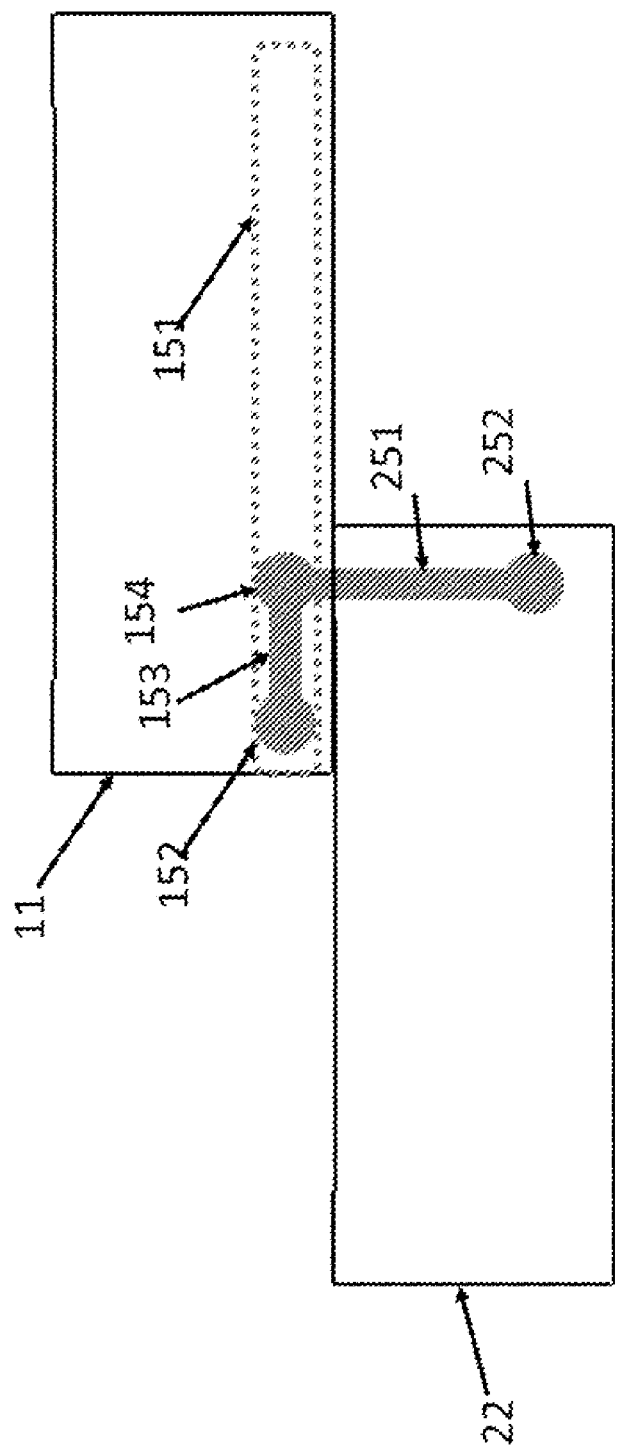
FIG. 6 shows another cross-section view of the electronic device of FIG. 1 with different configuration. In order to illustrate this configuration clearly, only the linking structure is shown.
Figure 7:
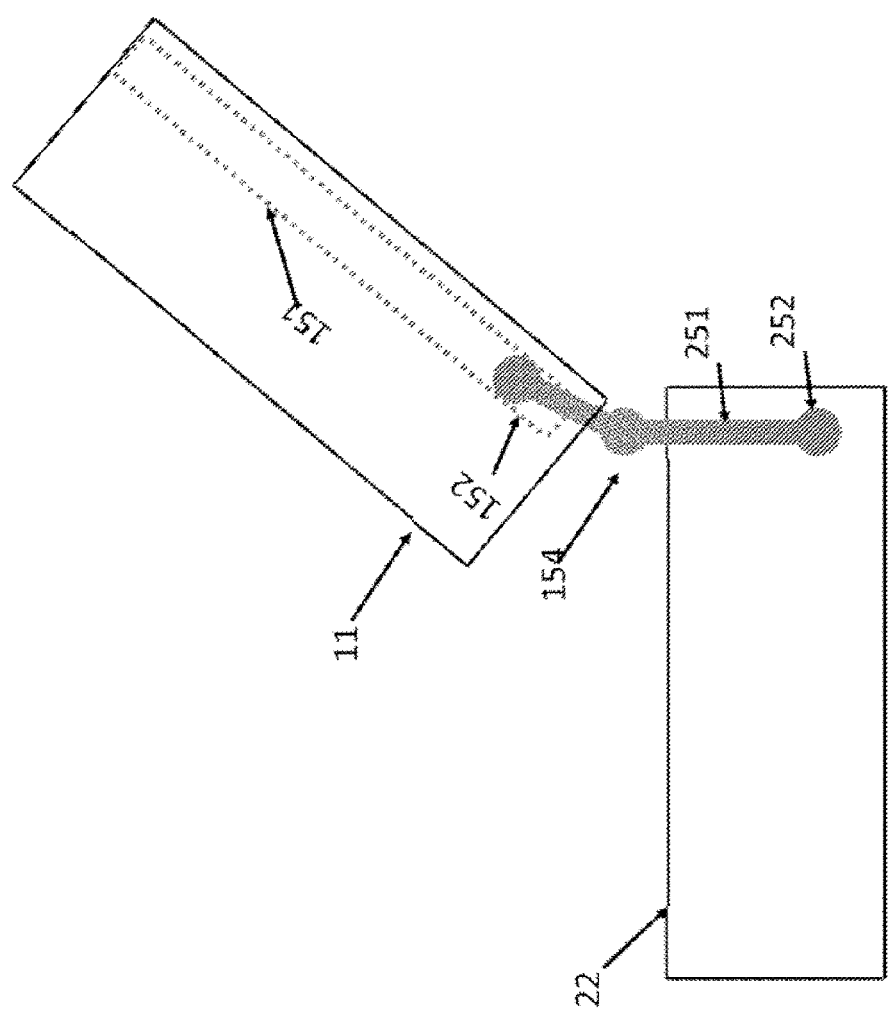
FIG. 7 shows another cross-section view of the electronic device of FIG. 1 with different configuration. In order to illustrate this configuration clearly, only the linking structure is shown.
Figure 8:
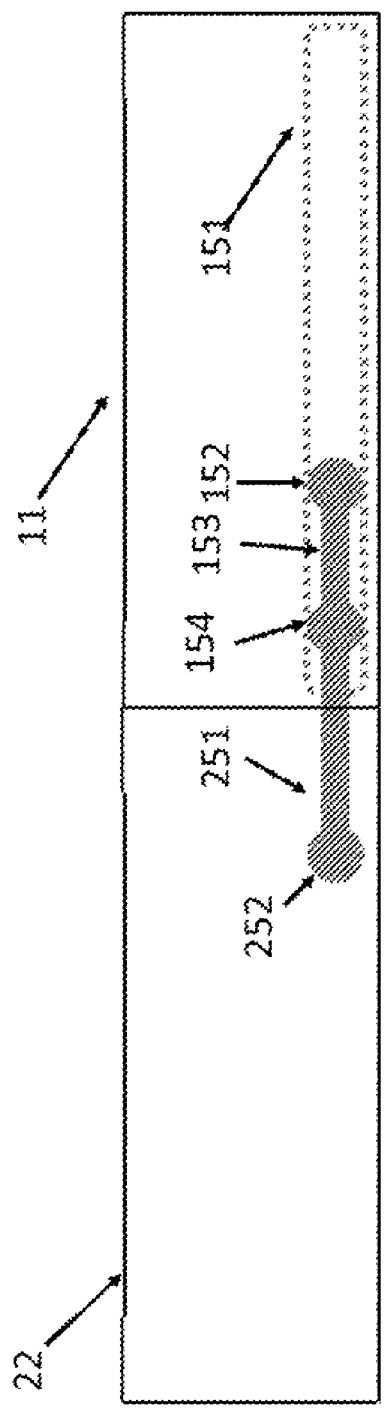
FIG. 8 shows another cross-section view of the electronic device of FIG. 1 with different configuration. In order to illustrate this configuration clearly, only the linking structure is shown.

FIGS. 5-8 show the linking structure between the first housing 1 and the second housing 2 with different configurations/position. Referring to FIG. 5, the linking structure comprises a first slot 151, a first shaft 152, a first lever 153, a second shaft 154, a second lever 251, and a third shaft 252 on each side of the device. The first housing 1 can slides with the second housing 2 through the first slot 151 as shown in FIG. 6. By the time the first housing 1 is reach one end of the second housing 2 or the first slot 151, the first lever 153 is configured to rotate with the second lever 251 as shown in FIG. 7. At this position, the first housing 1, with a portion of the linking structure is further rotated/pivoted with respect to the second housing 2 and, therefore, both first housing 1 and the second housing 2 are placed side by side in the same plane.

Figure 9:
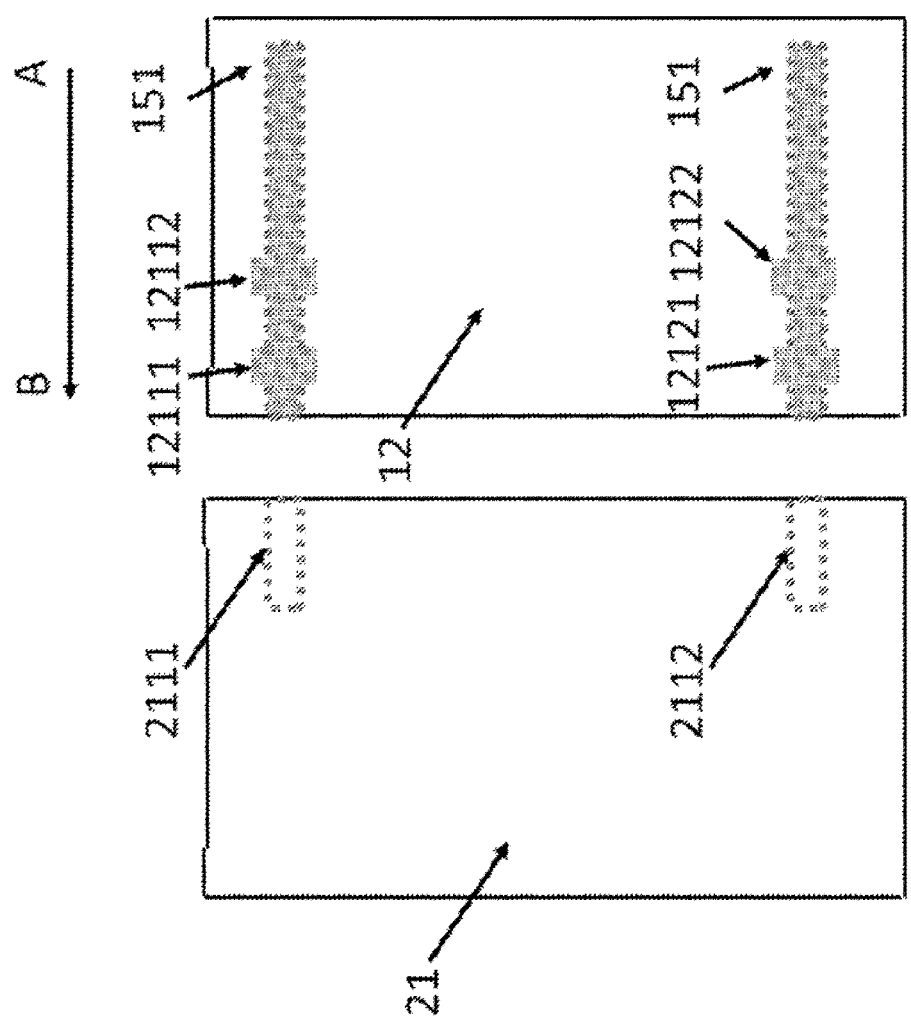
FIG. 9 shows another cross-section view of the electronic device of FIG. 1 with the linking structure. In order to illustrate this configuration clearly, only the linking structure with slots is shown.

FIG. 9 shows the first housing 1 further comprising first accommodation space 12111 and/or second accommodation space 12112 on each of the first slot 151. In case of the first housing 1 and the second housing 2 are placed side by side in the same plane (or the first housing 1 is on top of the second housing 2), the first housing 1 and the second housing 2 may be slide toward to each other (or from point A to point B). Therefore, the first and second shafts are engaged in the first accommodation space 12111 and second accommodation space 12112 on each of the first slot 151 respectively. Referring again to FIG. 9, the second housing 2 may further comprises a second slot 2111/2112 on each side of the device corresponding to the discussed first/second shafts and first/second levers on each side of the device. Therefore, the first housing 1 may further pull away from the second housing 2.

The exterior surface of the first/second housing 2 of the portable electronic device comprises heat conduct materials such as metal, graphene/graphite, plastic, and/or the combination of some of these materials.

Further, all the display modules on both sides of the upper housing or both sides of the lower housing, as disclosed in this invention, can be implemented as touch screen which allows for typing the data through the display module.

The at least one heat generating component may be semiconductor chip, radio frequency (RF) chip, data storage, and/or other electronic components.

The operation of portable electronic device may generate heat with usage of the heat generating components as discussed in above paragraphs. This may results in an increase in the temperature(s) of the components. For instance, the user operations on the portable electronic device may cause the central processing unit (CPU) and associated chips of the device to heat up. Therefore, the local temperature(s) buildup may cause injury to a user. In addition, the electronic components/parts may lose reliability, and/or fail prematurely. Therefore, the portable electronic device may include structures for removing heat from the components inside the portable electronic device.

Because heat-dissipation materials may take up space within the portable electronic device and may also increase the material and assembly costs for portable electronic device. A heat remover/spreader may be flexible and comprising at least one layer of graphite may be positioned over the surface of the first energy module or the second energy module 122/123, or both of the first energy module and the second energy module 122/123. A heat remover/spreader comprising at least one layer of graphite may be positioned in thermal contact with circuit board and/or at least one heat generating component inside the portable electronic device to allow heat generated by the at least one heat generating component to spread to the at least one energy module 122/123, the airflow generator, the enclosure of the portable electronic device, and/or a top layer of the display module. The thickness of the at least one layer of the graphite/graphene/thermal film is as discussed in previous paragraph.

A first heat conduction means thermally connected between the at least one heat generating component, on either side of the circuit board and the display module, and the at least one energy module 122/123. In addition, the first heat conduction has the direction of the heat conduction from the at least one heat generating component, on either side of the circuit board and the display module, to the at least one energy module 122/123.

A second heat conduction means thermally connected between the at least one heat generating component, on either side of the circuit board and the display module, and the first (or second) front wall, with heat remover materials. Furthermore, the first (or second) front wall with heat remover may further thermally connects/conducts to the at least one side wall with heat remover materials as discussed above. In addition, the second heat conduction has the direction of the heat conduction from the at least one heat generating component, on either side of the circuit board and the display module, to the top wall with heat remover. Therefore, the heat is removed from an enclosure of the portable electronic device through the conduction of the heat remover(s) (on the front wall and at least one side wall) as discussed above.

In case of the first housing 1, the second heat conduction may further conduct the heat from the at least one side wall to the rear wall via the second heat conduction path as discussed above.

In case of the second housing 2, the second heat conduction may further conduct the heat from the at least one side wall to the rear wall via the heat conduction path connected by the first/second engagements, as discussed above.

A third heat conduction means thermally connected between the at least one heat generating component, on either side of the circuit board, and the bottom wall heat remover. Furthermore, the bottom wall heat remover may further thermally connects/conducts to the rear wall heat remover. In addition, the third heat conduction has the direction of the heat conduction from the at least one heat generating component, on either side of the circuit board, to the bottom wall heat remover. Therefore, the heat is removed from an enclosure of the portable electronic device through the conduction of the heat remover(s) as discussed above.

As discussed above, the heat remover may be composed of graphene. The heat remover may be disposed over a surface of any energy module 122/123 and/or a surface of any heat generating component by attaching a monolayer of graphene onto the surface of the surface of any energy module 122/123 and/or the surface of any heat generating component.

Furthermore, the use of graphene in the heat remover/spreader may reduce the amount of space occupied by the heat remover/spreader very significantly while providing highly effective dissipation of heat from heat generator or heat source. The thermal conductivity of graphene near room temperature may range from $4.8\pm0.5\times10^3$ to $5.3\pm0.5\times10^3$ $Wm^{-1} K^{-1}$, which is obvious better than other materials like graphite, copper, carbon nanotube and/or diamond. Therefore, heat remover may remove heat away from any heat generator/source more effectively than any known material, included graphite, copper, carbon nanotube and/or diamond. Using graphene will increase reliability, safety, and performance during use of the portable electronic device.

In addition, the character of high tensile strength of graphene may results in a graphene monolayer less than one nanometer thickness to be used as heat remover/spreader compared to other heat spreader materials which may range in thickness from tens of microns to a millimeter scale. Consequently, as discussed above, the reduction in thickness/space sized by heat remover may results in a decrease in the portable electronic device's size/thickness and an increase in the portable electronic device's portability or design attractiveness. On the other hand, the extra space savings may increase the size of the energy module 122/123; add more components to the portable electronic device, therefore, further improve the functionality or operation hours of the portable electronic device.

The process of facilitating the use of heat remover comprising graphene in a portable electronic device in accordance with the disclosed embodiment(s) comprising:

First, the circuit board and/or display module with at least one heat generating component are arranged within an enclosure of the portable electronic device. Then, the at least one energy module is arranged closed to the at least one heat generating component. The at least one heat generating component may include a CPU, a graphic process unit (GPU), a PSU, a PCB, a RF components, a data storage such as SSD, HDD, or RAM, a backlight, a LED, a charging circuit, a signal circuit.

The energy module may correspond to a lithium-ion, solid-state or lithium-polymer battery, and/or thermoelectric materials which can convert the heat to electrical energy (and the reverse) with no moving parts.

Second, the heat remover comprising graphene is disposed over a surface of the energy module allowing heat transfer in either way. The graphene may be grown on a substrate and/or exfoliated from graphite. Then, the graphene is pressed onto the surface of the energy module. A adhesive material may be applied between the heat remover and the surface of the energy module.

Third, the heat remover comprising graphene is applied to the at least one of the heat generating component with thermal contact. Therefore, the heat remover may be extended over the battery onto the surface of a circuit board which is located side-by-side or in parallel with the battery.

With this arrangement step, the heat remover may transfer heat from the components to the energy module and/or other parts/components of the portable electronic device. As a result, the temperature of the energy module may increase and further extend runtime of the energy module which may include solid-state battery as discussed above.

The disclosed heat remover can be used in any type of electronic comprising data processor (CPU, GPU, PSU, PMU), a storage (RAM, SSD, etc.), a display, and energy module which provides power and/or convert heat to power. The portable electronic device may correspond to a wrist-worn device, tablet, laptop, personal digital assistant (PDA), medial player, mobile phone, digital camera/camcorder, and/or any battery-powered electronic device. Energy module may correspond to a battery pack included one or more battery cells along with a thermoelectric materials. The heat remover comprising graphene may be disposed over a contact surface of the energy module (included thermoelectric materials) and in thermal contact with the at least one of the heat generating component (as discussed above) of the portable electronic device. The heat remover may transfer heat from the at least one components to the energy module and/or other portion of the portable electronic device.

While certain embodiments have been described and shown in the accompanying drawings, it is to be understood, even though information as to, that such embodiments are merely illustrative and not restrictive of the current invention, and this invention is not restricted to the specific constructions and arrangements shown and described since modifications may apply to those ordinarily skilled in the art. Additionally, changes may be made in detail, especially in the matters of size, shape, and arrangement of parts within the present embodiments to the full extend indicated by the broad general meaning of the terms in which the appended claims are expressed.

What is claimed is:

1. A portable electronic device, comprising:
   a first housing comprising a front wall, a rear wall opposite to the first wall, and at least one side wall; and
   a second housing comprising a front wall, a rear wall opposite to the front wall, and at least one side wall, wherein the first housing slidably or rotatably connects to the second housing;
   the first housing and the second housing comprise a first circuit board and a second circuit board respectively, each circuit board comprising at least one heat generating component on at least one side of the corresponding circuit board, a display module comprising at least one heat generating component, wherein the display module generates images and displays through the front wall of the first housing or the second housing;
   both the first housing and the second housing comprise a first heat remover disposed over a surface of the at least one heat generating component on either one of the corresponding display module and the corresponding circuit board; and
   the front wall, the at least one side wall and the rear wall of the first housing comprise a first housing heat remover for conducting the heat on the corresponding housing; and the front wall, the at least one side wall and the rear wall of the second housing comprise a second housing heat remover for conducting the heat on the corresponding housing;
   when the first housing and the second housing are arranged in a first configuration, the rear wall of the first housing covers a significant portion of the front wall of the second housing, when the first housing and the second housing are arranged in a second configuration, at least a portion of the front wall of the first housing and at least a significant portion of the front wall of the second housing are exposed; and
   wherein, a first heat conduction path, in the first configuration, comprises the first heat remover in the first housing thermally connected to the first housing heat remover on both the front wall and the at least one side wall of the first housing and the second housing heat remover on both the at least one side wall and the rear wall of the second housing; and
   the first housing heat remover on the rear wall of the first housing and the second housing heat remover on the front wall of the second housing are thermally disconnected by magnetic force; and
   wherein, a second heat conduction path, in the second configuration, comprises the first heat remover in the first housing thermally connected to the first housing heat remover surrounding on the front wall, the at least one side wall, and the rear wall of the first housing, and the second housing heat remover surrounding on the front wall, the at least one side wall and the rear wall of the second housing.

2. The portable electronic device of claim 1, wherein the first heat remover further comprises a flexible portion thermally connecting the at least two heat generating components located on the corresponding circuit board with different horizontal levels.

3. The portable electronic device of claim 2, wherein the flexible portion comprising heat conduct materials further thermally contacts the at least one heat generating component located on the display module.

4. The portable electronic device of claim 3, wherein the flexible portion further extends to a gap between a thermal surface of the at least one heat generator and another adjacent portion of the portable electronic device and thermally contacts the thermal surface of the at least one heat generator, wherein the gap is less than 200 nm.

5. The portable electronic device of claim 1, wherein when the first housing and the second housing are arranged from one of the first or second configurations to the other, the first heat remover in the first housing further comprises an engagement portion which selectively and thermally contacts a reinforcing end of the first housing heat remover of the rear wall of the first housing.

6. The portable electronic device of claim 5, wherein the engagement portion of the first housing selectively and thermally connects and disconnects the reinforcing end of the first housing heat remover of the rear wall of the first housing depending on a magnetic force.

7. The portable electronic device of claim 1, wherein the second heat remover in the second housing further comprises a reinforcing portion end which selectively and thermally contacts an engagement end of the second housing heat remover of second housing depending on the configuration of the portable electronic device.

8. The portable electronic device of claim 7, wherein the reinforcing portion of the second housing selectively and thermally connects and disconnects the engagement end of the second housing heat remover depending on a magnetic force.

9. A portable electronic device, comprising:
   a first housing comprising a front wall, a rear wall opposite to the first wall, and at least one side wall; and a second housing comprising a front wall, a rear wall opposite to the front wall, and at least one side wall, wherein the first housing slidably or rotatably connects to the second housing;

the first housing and the second housing comprise a first circuit board and a second circuit board respectively, each circuit board comprising at least one heat generating component on at least one side of the corresponding circuit board, a display module comprising at least one heat generating component, wherein the display module generates images and displays through the front wall of the first housing or the second housing;

both the first housing and the second housing comprise a first heat remover disposed over a surface of the at least one heat generating component on either one of the corresponding display module and the corresponding circuit board; and the front wall, the at least one side wall and the rear wall of the first housing comprise a first housing heat remover for conducting the heat on the corresponding housing; and the front wall, the at least one side wall and the rear wall of the second housing comprise a second housing heat remover for conducting the heat on the corresponding housing;

when the first housing and the second housing are arranged: in a first configuration, the rear wall of the first housing covers a significant portion of the front wall of the second housing, when the first housing and the second housing are arranged in a second configuration, at least one portion of the side wall of the first housing and at least one portion of the side wall of the second housing are overlapped; and wherein, a first heat conduction path, in the first configuration, comprises the first heat remover in the first housing thermally connected to the first housing heat remover on both the front wall and the at least one side wall of the first housing and the second housing heat remover on both the at least one side wall and the rear wall of the second housing; and the first housing heat remover on the rear wall of the first housing and the second housing heat remover on the front wall of the second housing are thermally disconnected by magnetic force; and wherein, a second heat conduction path, in the second configuration, comprises the first heat remover in the first housing thermally connected to the first housing heat remover surrounding on the front wall, the at least one side wall, and the rear wall of the first housing, and the first heat remover thermally connected to the second housing heat remover surrounding on the front wall, the at least one side wall and the rear wall of the second housing through the at least one portion of the side wall of the first housing and at least one portion of the side wall of the second housing.

10. The portable electronic device of claim 9, wherein the first or second housing heat removers further comprises at least one flexible portion thermally contacting the at least one heat generating component located on the corresponding circuit board; the at least one flexible portion extends into a gap between a thermal surface of the at least one heat generating component and another adjacent portion of the portable electronic device with the gap less than 60 nm.

11. The portable electronic device of claim 9, wherein the first or second housing heat removers further comprises at least one flexible portion thermally contacting the at least one heat generating component located on the corresponding circuit board; the at least one flexible portion extends into a gap between a thermal surface of the at least one heat generating component and another adjacent portion of the corresponding adjacent circuit board in the portable electronic device with the gap less than 20 nm.

12. The portable electronic device of claim 9, wherein the first or second housing heat removers further comprises at least one flexible portion thermally contacting the at least one heat generating component located on the corresponding circuit board; the at least one flexible portion extends into a gap between the display module and another adjacent portion of the at least one heat generating component on the corresponding adjacent circuit board in the portable electronic device with the gap less than 100 nm.

13. The portable electronic device of claim 9, wherein the first or second housing heat removers further comprises at least one flexible portion thermally contacting the at least one heat generating component located on the corresponding circuit board; the at least one flexible portion extends into a gap between the display module and another adjacent portion of the corresponding adjacent circuit board in the portable electronic device with the gap less than 40 nm.

14. The portable electronic device of claim 9, wherein the second heat remover in the second housing further comprises a reinforce portion end which selectively and thermally contacts an engagement end of the second housing heat remover of second housing depending on the configuration of the portable electronic device.

15. The portable electronic device of claim 9, wherein the reinforcing portion of the second housing selectively and thermally connects and disconnects the engagement end of the second housing heat remover depending on a magnetic force.

16. The portable electronic device of claim 15, wherein the first or second housing heat removers further comprises at least one flexible portion thermally contacting the at least one heat generating component located on the corresponding circuit board; the at least one flexible portion extends into a gap between a thermal surface of the at least one heat generating component and another adjacent outer housing of the portable electronic device with the gap less than 60 nm.

17. The portable electronic device of claim 15, wherein the first or second housing heat removers further comprises at least one flexible portion thermally contacting the at least one heat generating component located on the corresponding circuit board; the at least one flexible portion extends into a gap between a thermal surface of the at least one heat generating component and another adjacent heat generating component in the portable electronic device with a gap less than 60 nm.

18. The portable electronic device of claim 15, wherein the first or second housing heat removers further comprises at least one flexible portion thermally contacting the at least one heat generating component located on the corresponding circuit board; the at least one flexible portion extends into a gap between a thermal surface of the at least one heat generating component and another adjacent portion of the display module in the portable electronic device with a gap less than 40 nm.

19. The portable electronic device of claim 15, wherein the first or second housing heat removers further comprises at least one flexible portion thermally contacting the at least one heat generating component located on the corresponding circuit board; the at least one flexible portion extends into a gap between a thermal surface of the at least one heat generating component and another adjacent portion of the corresponding circuit board in the portable electronic device with a gap less than 20 nm.

\* \* \* \* \*